(12) United States Patent
Jürgensen et al.

(10) Patent No.: US 7,067,012 B2
(45) Date of Patent: Jun. 27, 2006

(54) CVD COATING DEVICE

(75) Inventors: Holger Jürgensen, Aachen (DE); Johannes Käppeler, Würselen (DE); Gerhard Karl Strauch, Aachen (DE)

(73) Assignee: Aixtron AG (DE)

( * ) Notice: Subject to any disclaimer, the term of this patent is extended or adjusted under 35 U.S.C. 154(b) by 299 days.

(21) Appl. No.: 10/378,494

(22) Filed: Mar. 3, 2003

(65) Prior Publication Data
US 2003/0221624 A1    Dec. 4, 2003

Related U.S. Application Data

(63) Continuation of application No. PCT/EP01/09795, filed on Aug. 24, 2001.

(30) Foreign Application Priority Data

Sep. 1, 2000 (DE) .............................. 100 43 600

(51) Int. Cl.
*H01L 21/00* (2006.01)
*C23C 16/00* (2006.01)
*C30B 25/00* (2006.01)

(52) U.S. Cl. ...................... 118/730; 118/725; 118/715; 118/724; 219/648; 204/298.01; 156/345.52; 156/345.55

(58) Field of Classification Search ................ 118/725, 118/730, 715, 724; 204/298.01; 219/648; 156/345.52, 345.55
See application file for complete search history.

(56) References Cited

U.S. PATENT DOCUMENTS 5,782,979 A * 7/1998 Kaneno et al. ............. 118/500
5,820,686 A * 10/1998 Moore ........................ 118/730

FOREIGN PATENT DOCUMENTS

| DE | 19813523 | | 10/1999 |
| JP | 60058613 A | * | 4/1985 |
| JP | 02212394 A | * | 8/1990 |

* cited by examiner

*Primary Examiner*—Ram N Kackar
(74) *Attorney, Agent, or Firm*—St. Onge Steward Johnston & Reens LLC

(57) ABSTRACT

The invention relates to a device for depositing especially, crystalline layers onto one or more, especially, also crystalline substrates in a process chamber using reaction gases which are guided into said process chamber, where they undergo pyrolytic reaction. The device has a heatable support plate wherein at least one substrate holder lies loosely, especially rotationally, with its surface flush with the surroundings. A compensation plate which adjoins the at least one substrate holder, following the contours of the same, is provided on the support plate in order to keep the isothermal profile on the support plate as flat as possible.

13 Claims, 3 Drawing Sheets

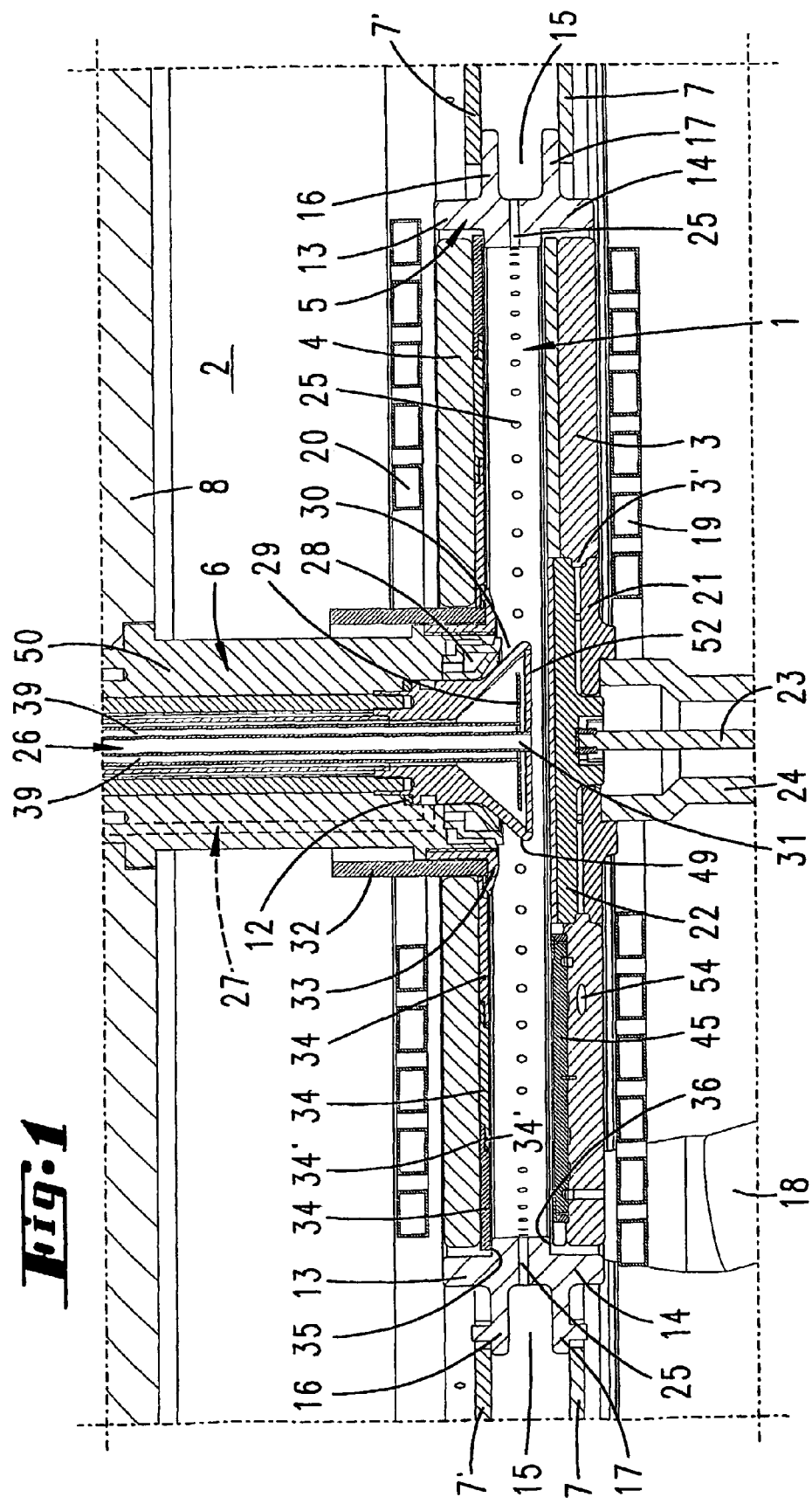

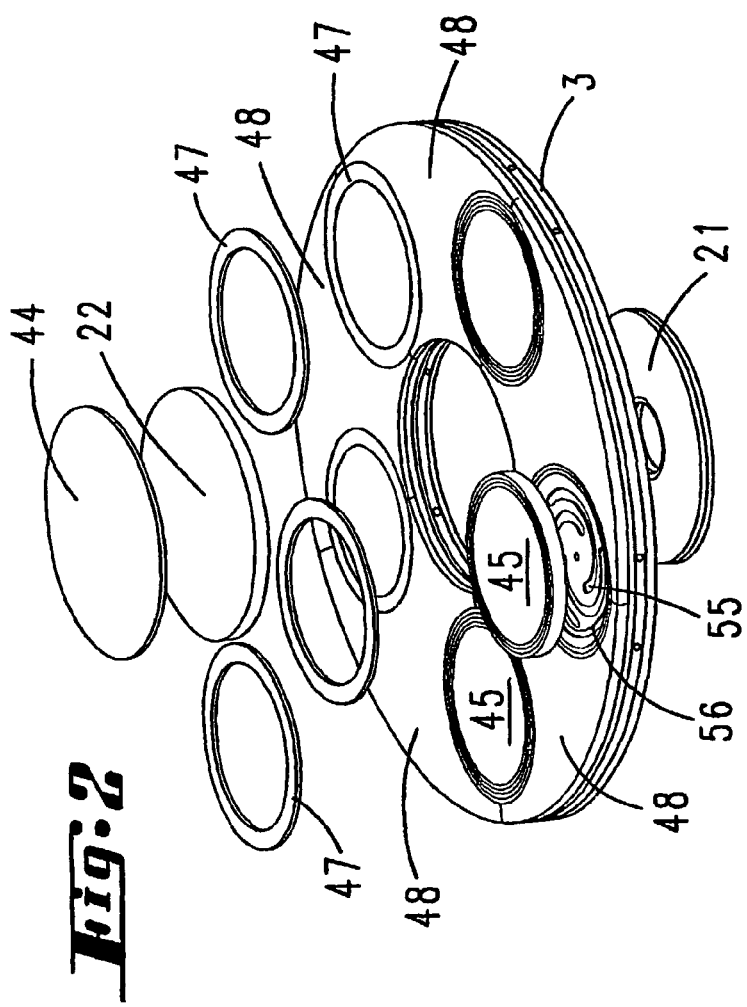
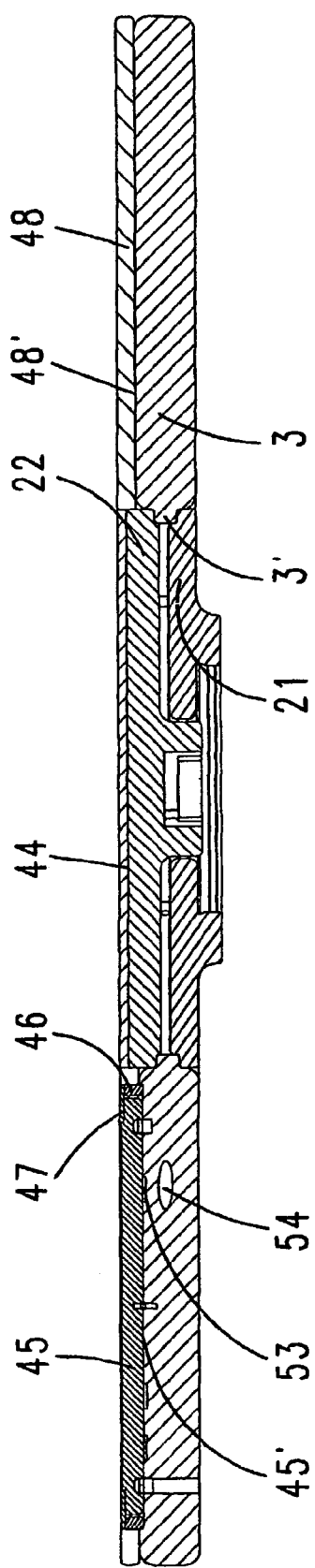

CVD COATING DEVICE

This application is a continuation of pending International Patent Application No. PCT/EP01/09795 filed Aug. 24, 2001, which designates the United States and claims priority of pending German Application No. 100 43 600, filed Sep. 1, 2000.

FIELD OF THE INVENTION

The invention relates to a device for depositing in particular crystalline layers on one or more, in particular likewise crystalline substrates in a process chamber by means of reaction gases which are introduced into the process chamber where they react pyrolytically, having a heatable carrier plate, in which at least one substrate holder rests loosely, in particular rotatably, with its surface flush with the surroundings.

A device of this type is already known from U.S. Pat. No. 5,788,777, U.S. Pat. No. 5,027,746 and DE patent 19 813 523 C2. Substrate holders rest loosely in associated cutouts in the graphite carrier plate, which can be heated from the rear side in particular using high frequency. In the prior art, the substrate holders, lying on a gas cushion, are driven in rotation as a result of a particular gas passage configuration in the base of the carrier plates cut-out. The fact that the substrate holder rests loosely on the base of the cutout of the carrier plate in which the substrate holder is located in such a way that its surface is positioned flush with respect to its surroundings leads to the formation of a horizontal joint which may even be widened if the substrate holder is driven in rotation in the manner described. This horizontal joint disrupts the heat transfer from the heating which lies at the back of the carrier plate to the process chamber. The result of this is that the surface temperature of the substrate holder is lower than the surface temperature of the surroundings. This also has effects on the isothermal profile in the gas flow over the carrier plate.

WO 96/23913 proposes an SiC protective plate for a substrate holder.

The invention is therefore based on the object of keeping the isothermal profile over the carrier plate as flat as possible.

The object is achieved by the solutions given in the claims.

Claim 1 proposes firstly and substantially a compensation plate which is located on the carrier plate and adjoins the substrate holder. The edge of the compensation plate follows the contour of the substrate holder. The substrate holder is surrounded by one or more compensation plates. It is preferable to provide a multiplicity of substrate holders which are disposed in planetary fashion on the carrier plate, which in particular is also driven in rotation. The compensation plates are then located in segment form on the annular carrier plate. The compensation plates may consist of TaC or of TaC- or SiC-coated graphite. They can be exchanged as consumable parts. Centering rings are provided for edgewise bearing support of the substrate holders, which are in the shape of circular discs, at the edge. These centering rings are likewise located in the cutouts in the carrier plate. The round edges of the compensation plates butt against these centering rings. Covering rings, which also cover a stepped edge section of the substrate holder, are located on the centering rings. The carrier plate is supported from below by means of a central support plate. This takes place by the support plate engaging beneath its edge. Above the support plate there may be a tension plate, which is likewise supported on the edge of the carrier plate. A tie rod may act in the center of the tension plate, so that the edge of the carrier plate is, as it were, clamped in place. The outer boundary of the process chamber is formed by a gas discharge ring, which has a multiplicity of radial gas outlet openings. This ring, like a cover plate, which extends parallel to and at a spacing from the carrier plate and is likewise heated from the back, is to consist of solid graphite. On account of this configuration, the gas-discharge ring has an increased heat capacity and, at the same time, good heat conduction, so that there is a constant temperature profile from cover plate to carrier plate.

Furthermore, the invention relates to a development of the cover plate which is in principle already known from U.S. Pat. No. 5,788,777 and the way in which it is held at the gas admission element. For the epitaxial growth of SiC using the reaction gases silane and methane/propane, the carrier plate, which consists of graphite, and a cover plate, which likewise consists of graphite, are inert-coated. The coating may consist of TaC or SiC. Cover or carrier plates which have been coated in this manner are subject to wear, since the reaction gases have an etching action. According to the invention, the cover plate is lined with exchangeable lining rings which may consist of TaC. The lining rings are held together by engaging beneath one another. The edge of the inner ring can lie on the bearing shoulder of a support, which is seated on a gas admission element. In a variant of the invention, it is provided that the lining rings consist of graphite and are coated with TaC or SiC. The lining rings in each case rest on the inner ring with their edges bearing one on top of the other. The inner one of the lining rings disposed concentrically with respect to one another may be of multipart construction. Consideration may be given in particular to a segment-like multipart structure.

BRIEF DESCRIPTION OF THE DRAWINGS

An exemplary embodiment of the invention is explained below with reference to appended drawings, in which:

FIG. 1 shows, in diagrammatic representation, a process chamber of a reactor,

FIG. 2 shows an exploded view of the carrier plate and substrate holder,

FIG. 3 shows an enlarged section through the carrier plate in accordance with the sectional view shown in FIG. 1.

DETAILED DESCRIPTION OF THE DRAWINGS

Figure 4:
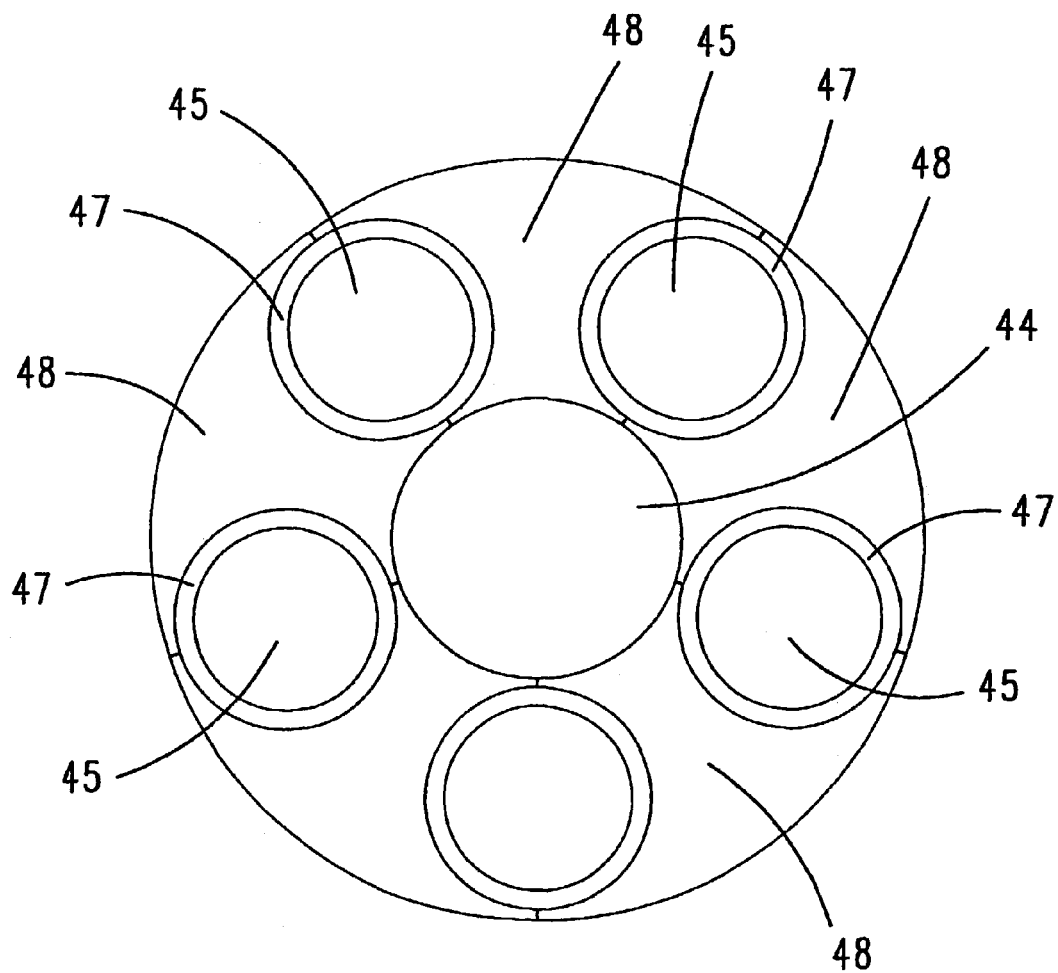
FIG. 4 shows a plan view of the carrier plate.

The device illustrated in the exemplary embodiment is used for the monocrystalline deposition of SiC layers on monocrystalline Si substrates, and these substrates may have a diameter of 4 inches.

A process chamber 1 is located in a reactor housing 2. This process chamber 1 has a carrier plate 3 which bears the substrate holders 45. Above the carrier plate 3, a cover plate 4 extends parallel to it. The carrier plate 3 is heated from below by means of a water-cooled HF coil 19. The cover plate 4 is heated from above by an HF coil 20, which is likewise water-cooled. The carrier plate 3 is of annular configuration, the outer diameter being approximately twice as great as the inner diameter. The inner wall of the carrier plate 3 has an annular step 3' which projects radially inwards. By means of this annular step 3'; the carrier plate 3 rests on the edge of a support plate 1. The support plate 1 is in turn supported on a support tube 24, through which a tie rod 23 projects. The tie rod 23 engages approximately centrally on a tension plate 22 which is disposed above the support plate 21 and the edge of which rests on the collar 3'. The carrier plate 3 is held from below as if by clamping jaws by tension applied to the tie rod 23.

The carrier plate 3 and the cover plate 4 are surrounded by a gas discharge ring 5. This gas discharge ring 5 forms the lateral process chamber wall. The gas discharge ring 5 has a multiplicity of radial bores 25 through which the process gas can emerge. The gas discharge ring 5, like the support plate 21, the tension plate 22, the carrier plate 3 and the cover plate 4 is made from solid graphite. It is in single-piece form and has a width which approximately corresponds to the height of the process chamber 1. As a result, the gas discharge ring 5 has a relatively high heat capacity, with the result that the temperature profile within the process chamber is highly homogenous even at the edge. Since the gas discharge ring 5 forms a step 35 over which the cover plate 4 engages and a step 36 beneath which the carrier plate engages, in regions it projects into the space between cover plate 4 and carrier plate 3.

On its underside, the cover plate 4 is lined with a total of three lining rings 34. These lining rings may consist of graphite or of TaC. They are held together like furnace rings by mutual engagement over one another, the innermost ring 34 being supported on an annular collar of a graphite carrier 33 which is screwed onto the lower end of the gas admission element 6. The lining rings 34 are rebated in the region where they lay one above the other. They form ring sections 34', 34" lying above one another, so their surface does not have any steps in it.

The gas admission element 6 is overall of two-part configuration. It has a core, which forms a section 49 which projects into the process chamber 1 and is frustoconical in shape. This core is surrounded by a casing 50. The casing 50 is sealed with respect to the core 49 by means of an O-ring seal 12.

The silane is supplied through the feedline 27. It emerges through an opening 30 in the shape of an annular wedge. The walls of the passage 30 are cooled. Behind the passage walls there are cooling-water chambers 28, through which cooling water flows in order to keep the wall temperature below the decomposition temperature of the silane.

The base surface 52, which is likewise held at a temperature at which the reaction gases do not decompose, on account of the application of cooling water from the rear, is located approximately in the center of the process chamber and runs parallel to the surface of the carrier plate 3. In the center of the base surface 52 is the opening 31 of the methane or propane feed line 26. The process gases are likewise passed, together with hydrogen, through the associated feed lines 26, 27.

To insulate the cover plate 4, which is heated up to approximately 1600° C. when the device is operating, from the cooled gas admission element 6, there is an insulation sleeve 32 made from a carbon foam which is seated on the support 33.

The carrier plate 3 is driven in rotation by means of the supporting tube 24. The carrier plate 3 also has passages 54 through which gas flows, emerging in helical grooves 55 which are located at the base of cutouts 56. The substrate holders 45 rest in the cutouts 56. They rotate on a gas cushion of the gas which flows through the helical grooves 55. The substrate holders 45 are surrounded by centering rings 46, which also rest in the cutout 56 and bear against the edge of the cutout. The edge region of the surface of the substrate holders 45 has a step. A covering ring 47, which also covers the centering ring 56, rests on this step. The regions between the substrate holders 45 and/or the centering rings 46 and/or covering rings 57 are filled by compensation plates 48. These rest loosely on the surface of the carrier plate 3. The surface of substrate holder 45, covering ring 47 and compensation plate 48 are flush with one another. The compensation plates 48 are preferably made from TaC and exchangeable.

If the carrier plate 3 is heated from below, the temperature jump in the region of the horizontal joint 48' between compensation plate 48 and carrier plate 3 is approximately identical to the temperature jump at the horizontal joint 45' between substrate holder 45 and carrier plate 3.

In the exemplary embodiment, a total of 5 substrate holders 45 are provided, disposed in planetary form around the center of the carrier plate 3. They have a circular outer contour. The compensation plates 48 are located between the substrate holders 45 and complement one another to form an annular configuration. The inner opening of the annular plate arrangement, in which the tension plate 22 is located, is filled by a circular compensation plate 44, which rests loosely on the tension plate 22.

All features disclosed are (inherently) pertinent to the invention. The disclosure content of the associated/appended priority documents (copy of the prior application) is hereby incorporated in its entirety in the disclosure of the application, partly for the purpose of incorporating features of these documents in claims of the present application.

What is claimed is:

1. A device for depositing in particular crystalline layers on one or more, in particular likewise crystalline substrates in a process chamber by means of reaction gases which are introduced into the process chamber, where they react pyrolytically, having a heatable carrier plate, in which at least one substrate holder rests loosely in a carrier plate cutout, in particular rotatably, with respect to the carrier plate, at least one compensation plate which is located on the carrier plate and adjoins the at least one substrate holder such that it follows the contours;

a centering ring located in the carrier plate cutout and surrounding the substrate holder, and a covering ring which is disposed over the centering ring and at least a portion of the substrate holder and is flush with the substrate holder, wherein, the top surface of the substrate holder and the covering ring are flush with the compensation plate.

2. The device in particular according to claim 1, characterized in that the compensation plate consists of TaC or TaC- or SiC-coated graphite.

3. The device according to claim 2 wherein the covering ring engages over a stepped edge of the substrate holder.

4. The device according to claim 3 or in particular according thereto, characterized in that the carrier plate is in the shape of a ring and is supported from below by a central support plate engaging beneath its edge.

5. The device according to claim 4 or in particular according thereto, characterized by a tension plate which is located above the support plate, is supported on the edge of the carrier plate and on which a tie rod acts.

6. The device according to claim 5 or in particular according thereto, characterized in that the outer diameter of the carrier plate is double its inner diameter.

7. The device according to claim 6 or in particular according thereto, characterized in that the carrier plate is driven in rotation.

8. The device according to claim 7 or in particular according thereto, characterized in that the rotatable substrate holder, resting on a gas cushion, is driven in rotation by gas streams which form the gas cushion.

9. The device according to claim 8 or in particular according thereto, characterized by a multiplicity of substrate holders which are disposed around the center of the carrier and are each driven in rotation by means of gas streams.

10. A device for depositing crystalline layers on a substrate in a process chamber by means of reaction gases introduced into the process chamber comprising:

a heatable carrier plate having at least one cutout, the carrier plate being rotatable with respect to the reaction gas;

at least one compensation plate positioned on the carrier plate and adjoining the at least one substrate holder, said at least one compensation plate substantially following the contours, at least one substrate holder loosely positioned in the at least one cutout, being rotatable with respect to the carrier plate and being flush with the top surface of the compensation plate, a centering ring located in the cutout and encircling the substrate holder, and a covering ring positioned over at least the centering ring and being flush with the substrate holder.

11. The device according to claim 10 wherein the centering ring and the covering ring are provided as separate rings with the covering ring positioned in the cutout substantially flush with the at least one compensation plate.

12. The device according to claim 10 wherein the covering ring is further positioned over at least a portion of the substrate holder.

13. The device according to claim 12 wherein the covering ring engages over a stepped edge of the substrate holder.

* * * * *